United States Patent
Lee et al.

(10) Patent No.: US 9,780,132 B2
(45) Date of Patent: Oct. 3, 2017

(54) IMAGE SENSOR AND ELECTRONIC DEVICE INCLUDING THE SAME

(71) Applicant: SK hynix Inc., Gyeonggi-do (KR)

(72) Inventors: Won-Jun Lee, Gyeonggi-do (KR); Kyoung-In Lee, Gyeonggi-do (KR); Cha-Young Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/813,792

(22) Filed: Jul. 30, 2015

(65) Prior Publication Data
US 2016/0071895 A1    Mar. 10, 2016

(30) Foreign Application Priority Data

Sep. 4, 2014   (KR) .................. 10-2014-0117884
Jun. 9, 2015   (KR) .................. 10-2015-0080999

(51) Int. Cl.
*H04N 5/225*    (2006.01)
*H01L 27/146*    (2006.01)
*H04N 5/369*    (2011.01)

(52) U.S. Cl.
CPC .... *H01L 27/14627* (2013.01); *H01L 27/1462* (2013.01); *H01L 27/14605* (2013.01); *H01L 27/14621* (2013.01); *H01L 27/14625* (2013.01); *H04N 5/3696* (2013.01)

(58) Field of Classification Search
None
See application file for complete search history.

(56) References Cited

U.S. PATENT DOCUMENTS

| | | | |
|---|---|---|---|
| 2006/0170810 A1* | 8/2006 | Kim | G02B 3/0018 348/340 |
| 2010/0123818 A1* | 5/2010 | Ono | H04N 5/23212 348/345 |
| 2010/0208368 A1* | 8/2010 | Yin | H01L 27/14627 359/808 |

* cited by examiner

*Primary Examiner* — Stephen Coleman
(74) *Attorney, Agent, or Firm* — IP & T Group LLP

(57) ABSTRACT

This technology provides an image sensor and an electronic device including the same. In an image sensor including a pixel array including a plurality of unit pixels, each of the plurality of unit pixels may include a photoelectric conversion element and a pixel lens over the photoelectric conversion element and comprising a plurality of light condensing layers in which a lower layer has a larger area than an upper layer, wherein the pixel lens has a shape changing based on a position of a corresponding unit pixel from a center of the pixel array to an edge of the pixel array.

18 Claims, 7 Drawing Sheets

IMAGE SENSOR AND ELECTRONIC DEVICE INCLUDING THE SAME

CROSS-REFERENCE TO RELATED APPLICATIONS

The present application claims priority of Korean Patent Application Nos. 10-2014-0117884 and 10-2015-0080999, filed on Sep. 4, 2014 and Jun. 9, 2015, respectively, which are herein incorporated by reference in their entirety.

BACKGROUND

Exemplary embodiments of the present invention relate to a semiconductor device manufacturing technology, and more particularly, to an image sensor including a light condensing member having a multilayer stepped shape and an electronic device including the same.

An image sensor converts an optical age into electrical signals. Due to the development of the computer and communication industries, the demand for image sensors with improved performance has increased in various fields such as digital cameras, camcorders, Personal Communication Systems (PCS), game machines, security cameras, medical micro-cameras, and robots.

SUMMARY

Various embodiments are directed to an image sensor having improved performance and an electronic device including the same.

In an embodiment, in an image sensor including a pixel array including a plurality of unit pixels, wherein each of the plurality of unit pixels may include a photoelectric conversion element; and a pixel lens over the photoelectric conversion element and comprising a plurality of light condensing layers in which a lower layer has a larger area than an upper layer, wherein the pixel lens has a shape changing based on its position from a center of the pixel array to an edge of the pixel array. Furthermore, each of the plurality of unit pixels may further include a focusing layer between the photoelectric conversion element and the pixel lens; a color filter layer covering the pixel lens; and an anti-reflection structure over the color filter layer.

The pixel lens may be symmetrical based on a central axis of each of the plurality of unit pixels and an area of the pixel lens may be gradually increased from the center of the pixel array to the edge of the pixel array. A width of the lower layer exposed by the upper layer in the plurality of light condensing layers may be constant regardless of its position in the pixel array. The width of the lower layer exposed by the upper layer may be smaller than a wavelength of incident light.

The pixel lenses of each of the plurality of unit pixels may be the same size, and asymmetry of the pixel lens may be gradually increased based on a central axis of each of the plurality of unit pixels going from the center of the pixel array to the edge of the pixel array. A maximum width of the lower layer exposed by the upper layer in the plurality of light condensing layers may be gradually increased going from the center of the pixel array to the edge of the pixel array. The maximum width of the lower layer exposed by the upper layer may be smaller than a wavelength of incident light. The upper layer of the plurality of light condensing layers may be shifted more to the center of the pixel array based on the central axis of each of the plurality of unit pixels going from the center of the pixel array to the edge of the pixel array. On the other hand, the upper layer of the plurality of light condensing layers may be shifted more to the edge of the pixel array based on the central axis of each of the plurality of unit pixels going from the center of the pixel array to the edge of the pixel array.

The pixel lens may have a multilayer stepped shape. The plurality of light condensing layers of the pixel lens may have the same shape and may be parallel to each other. A thickness of the upper layer of the plurality of light condensing layers may be less than or equal to a thickness of the lower layer. A refractive index of the upper layer of the plurality of light condensing layers may be less than or equal to a refractive index of the lower layer.

In an embodiment, an electronic device may include an optical system; an image sensor suitable for receiving light from the optical system and comprising a pixel array including a plurality of unit pixels; and a signal processing unit suitable for performing a signal processing operation on a signal output from the image senso. Each of the plurality of unit pixels of the image sensor may include a photoelectric conversion element; and a pixel lens over the photoelectric conversion element and comprising a plurality of light condensing layers in which a lower layer has a larger area than an upper layer, wherein the pixel lens has a shape changing based on a position of a corresponding unit pixel going from a center of the pixel array to an edge of the pixel array. Furthermore, each of the plurality of unit pixels may further include a focusing layer between the photoelectric conversion element and the pixel lens; a color filter layer covering the pixel lens; and an anti-reflection structure over the color filter layer.

The pixel lens may be symmetrical based on a central axis of each of the plurality of unit pixels and an area of the pixel lens may be gradually increased going from the center of the pixel array to the edge of the pixel array. The pixel lenses of the unit pixels may be the same size, and asymmetry of the pixel lens may be gradually increased based on a central axis of each of the plurality of unit pixels from the center of the pixel array to the edge of the pixel array. The pixel lens may have a multilayer stepped shape. A width of the lower layer exposed by the upper layer in the plurality of light condensing layers may be smaller than a wavelength of incident light.

DETAILED DESCRIPTION

Figure 1:
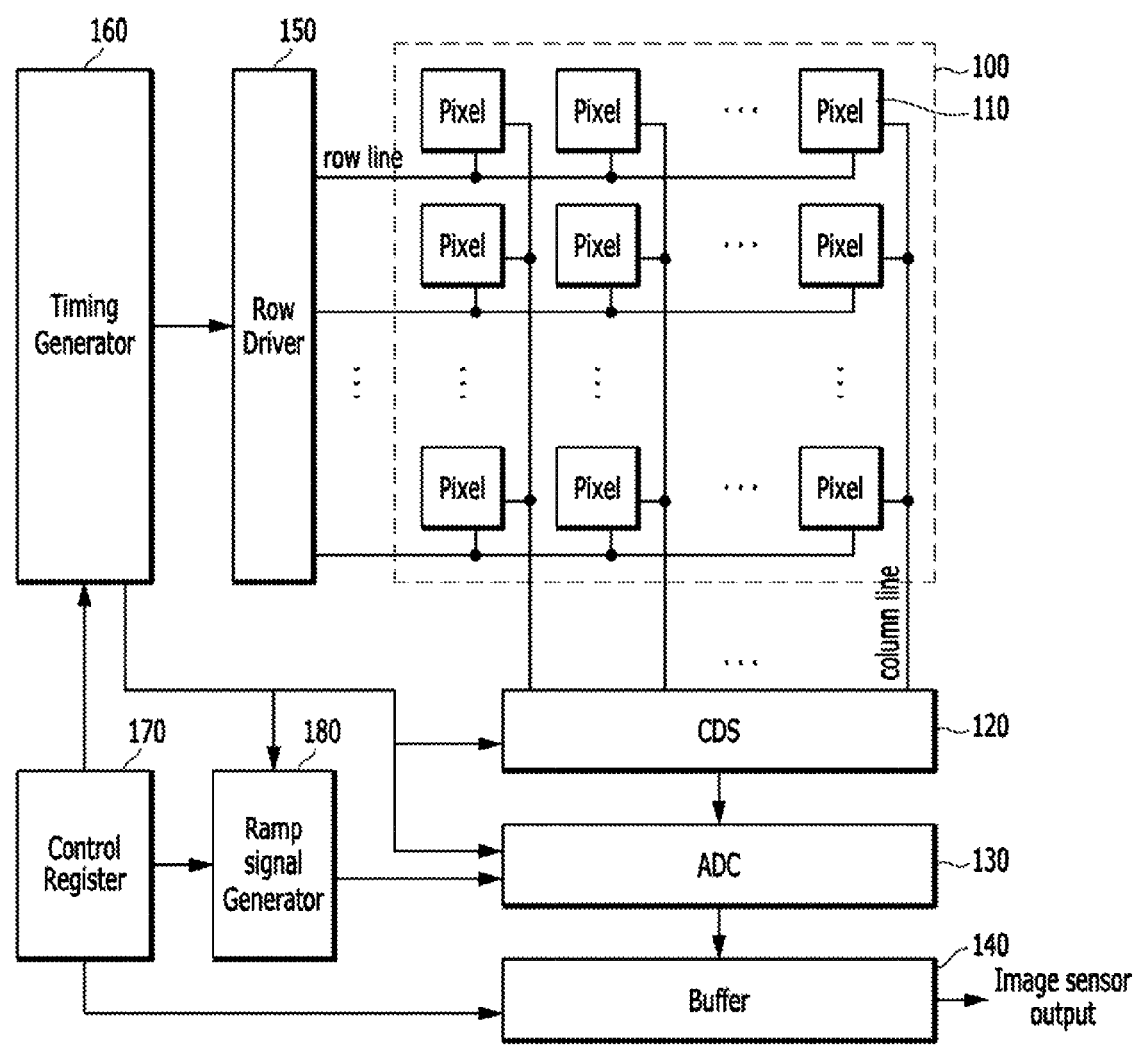
FIG. 1 is a block diagram schematically illustrating an image sensor in accordance with an embodiment of the present invention.

Hereinafter, embodiments of the present invention are described with reference to the accompanying drawings in order to describe the concept of the present invention in detail to the extent that those skilled in the art to which the present invention pertains may easily practice it. The drawings are not necessarily to scale and, in some instances proportions of structures illustrated in the drawings may have been exaggerated. The position and sequence of layers may be changed. Furthermore, all the layers of a multilayer structure may not be shown in the drawings (e.g., one or more additional layers may be present between two illustrated layers). For example, in a multilayer structure, when a first layer is referred to as being "on" a second layer or "on" a substrate, it not only refers to where the first layer is formed directly on the second layer or the substrate but also to where a third layer exists between the first layer and the second layer or the substrate.

The embodiments of the present invention provide an image sensor with improved performance and an electronic device having the same. As light condensing efficiency in unit pixels improves, performance of the image sensor improves. In general, an image sensor may include a plurality of unit pixels. Each of the unit pixels may include a hemispherical type micro lens (ML) disposed over a photoelectric conversion element. Through the micro lens, incident light may be condensed and transmitted into the photoelectric conversion element. The light condensing efficiency of the unit pixel may depend on the quality of the micro lens. The light condensing efficiency may be controlled according to a focal length between the micro lens and the photoelectric conversion element.

In a conventional micro lens, the focal length between the micro lens and the photoelectric conversion element is likely to change during a process of changing the curvature of the micro lens. Thus, it is not easy to control the focal length.

The micro lens may be formed through a process of reflowing a lens forming material, for example, a resist. In such a process, it is difficult to form a hemispherical shape with a desired curvature. Furthermore, since the micro lens is formed over a color filter layer, applicable materials are limited. In addition, the reflow process may be expensive, may only form hemispherical shapes, and there may be difficulties in forming micro lenses that are symmetrical and uniform. This may increases crosstalk.

The following embodiments of the present invention provide an image sensor with improved light condensing efficiency in unit pixels and an electronic device having the same. For this structure, each of the unit pixels may include a pixel lens having a plurality of light condensing layers which are formed over a photoelectric conversion element. A lower layer of the plurality of light condensing layers has a larger area or critical dimension (CD) than an upper layer of the plurality of light condensing layers. Thus, the pixel lens may have a multilayer stepped structure. The pixel lens having the multilayer stepped structure exhibits sub-wavelength optics or sub-wavelength effects to condense incident light. The pixel lens may effectively condense light within a limited area. Thus, the pixel lens according to an embodiment is advantageous in increasing integration of the image sensor and may easily vary focal length. According to the sub-wavelength optics, an optical effect may be obtained in a spatial scale smaller than a half of a wavelength of incident light.

FIG. 1 is a block diagram schematically illustrating an image sensor in accordance with an embodiment of the present invention.

As illustrated in FIG. 1, the image sensor in accordance with the embodiment of the present invention may include a pixel array 100, a correlated double sampler (CDS) 120, an analog-to-digital converter (ADC) 130, a buffer 140, a row driver 150, a timing generator 160, a control register 170, and a ramp signal generator 180. The pixel array 100 may include a plurality of unit pixels 110 arranged in a matrix shape.

The timing generator 160 may generate one or more control signals for controlling the row driver 150, the CDS 120, the ADC 130, and the ramp signal generator 180. The control register 170 may generate one or more control signals for controlling the ramp signal generator 180, the timing generator 160, and the buffer 140.

The row driver 150 may drive the pixel array 100 on a row line basis. For example, the row driver 150 may generate a select signal for selecting any one row line of a plurality of row lines. Each of the unit pixels 110 may sense incident light and output an image reset signal and an image signal to the CDS 120 through a column line. The CDS 120 may perform sampling on the image reset signal and the image signal.

The ADC 130 may compare a ramp signal outputted from the ramp signal generator 180 with a sampling signal outputted from the CDS 120, and output a comparison signal. In response to a clock signal provided from the timing generator 160, the ADC 130 may count the level transition time of the comparison signal, and output the count value to the buffer 140. The ramp signal generator 180 may generate the ramp signal under control of the timing generator 150 and the control register 170.

The buffer 140 may store a plurality of digital signals outputted from the ADC 130, and then sense and amplify the digital signals. Thus, the buffer 140 may include a memory (not illustrated) and a sense amplifier (not illustrated). The memory may serve to store count values. The count values are related to signals outputted from the plurality of unit pixels 110. The sense amplifier may serve to sense and amplify the count values outputted from the memory.

In the above-described image sensor, each of the unit pixels may include a pixel lens capable of improving light condensing efficiency. Hereinafter, a unit pixel including a pixel lens will be described in detail with reference to the accompanying drawings.

Figure 2A:
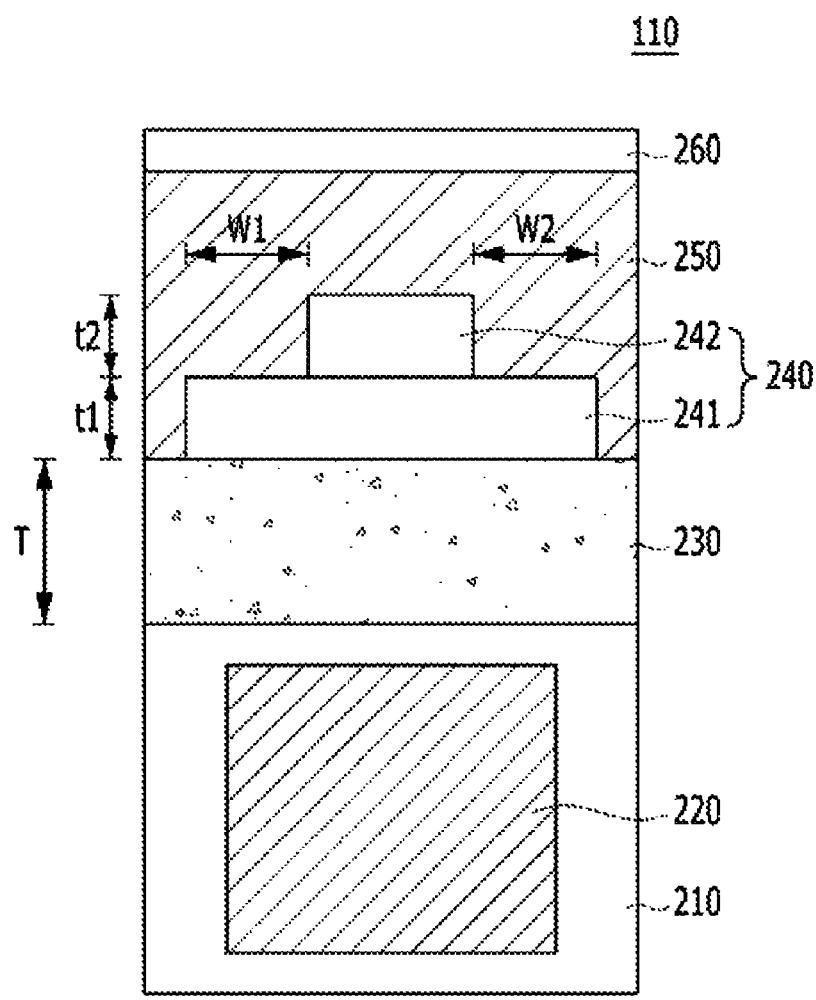
FIGS. 2A and 2B are cross-sectional views illustrating a unit pixel of the image sensor shown in FIG. 1.
Figure 2B:
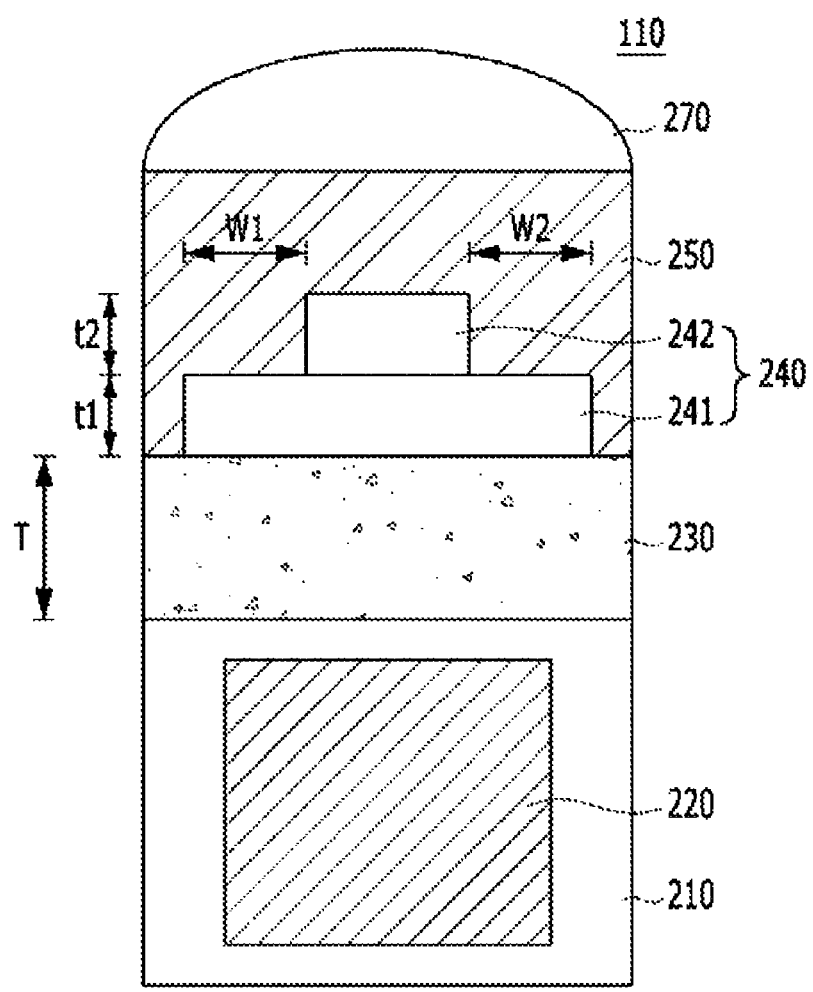

FIGS. 2A and 2B are cross-sectional views illustrating the unit pixel 110 of the image sensor shown in FIG. 1.

As illustrated in FIGS. 2A and 2B, each of the unit pixels 110 may include a substrate 210, a focusing layer 230, a pixel lens 240, a color filter layer 250, and an anti-reflection structure 260 or 270. The substrate 210 may include a photoelectric conversion element 220. The focusing layer 230 may be formed over the substrate 210. The pixel lens 240 may be formed over the focusing layer 230 and include a plurality of light condensing layers in which a lower layer has a larger area or critical dimension (CD) than an upper layer. The color filter layer 250 may be formed over the focusing layer 230 to cover the pixel lens 240. The anti-reflection structure 260 or 270 may be formed over the color filter layer 250.

In the present embodiment, the pixel lens 240 may include a first light condensing layer 241 formed over the focusing layer 230 and a second light condensing layer 242 formed over the first light condensing layer 241 and having a smaller area than the first light condensing layer 241. The first light condensing layer 241 may correspond to the lower layer, and the second light condensing layer 242 may correspond to the upper layer. Hereinafter, the first light condensing layer is referred to as a "lower light condensing layer 241" and the second light condensing layer is referred to as an "upper light condensing layer 242".

The substrate 210 may include a semiconductor substrate. The semiconductor substrate may have a single crystal state and include a silicon-containing material. That is, the substrate 210 may include a single-crystal silicon containing material.

The photoelectric conversion element 220 may include photo diodes. For example, the photoelectric conversion element 220 formed over the substrate 210 may include a plurality of photoelectric conversion layers (not illustrated) which are vertically stacked over the substrate 210. Each of the photoelectric conversion layers may serve as a photodiode including an N-type impurity region and a P-type impurity region.

The focusing layer 230 may serve to adjust a distance at which incident light condensed through the pixel lens 240 reaches the photoelectric conversion element 220, that is, a focal length. Due to the focusing layer 230, the focal length may be adjusted without a variation of curvature, unlike a conventional device in which the focal length is adjusted using a hemispherical micro lens with a given curvature. Furthermore, a shorter focal length may be set within a limited space. The focal length may be inversely proportional to a thickness T of the focusing layer 230. For example, the focal length may be shortened as the thickness T of the focusing layer 230 increases, and lengthened as the thickness T of the focusing layer 230 decreases.

To effectively transmit the incident light condensed through the pixel lens 240 to the photoelectric conversion element 220, the focusing layer 230 may have an area equal to or larger than that of the pixel lens 240. The focusing layer 230 may have a shape corresponding to each of the unit pixels 110. Thus, between the adjacent unit pixels 110, the focusing layers 230 may be in contact with each other. For example, the focusing layer 230 may have a rectangular shape.

To more effectively transmit the incident light condensed through the pixel lens 240 to the photoelectric conversion element 220, the focusing layer 230 may have a larger refractive index than the pixel lens 240. The focusing layer 230 may include any materials having a larger refractive index than the pixel lens 240.

Since the focusing layer 230 is positioned at the bottom of the color filter layer 250, the focusing layer 230 may include various materials used in a typical semiconductor fabrication process. For example, the focusing layer 230 may include transparent materials which include inorganic materials such as silicon oxide, silicon nitride, and titanium nitride. The focusing layer 230 may have a single-layer structure or multilayer structure in which transparent materials having different refractive indexes are stacked. When the focusing layer 230 has the multilayer structure, the refractive index of the focusing layer 230 may vary depending on position. A lower layer of the multilayer structure may have a refractive index larger than an upper layer of the multilayer structure.

The pixel lens 240 may serve as a light condensing member to condense incident light. To improve light condensing efficiency, the pixel lens 240 may have a multilayer structure in which two or more light condensing layers 241 and 242 are stacked. The upper light condensing layer 242 may have a smaller area or CD than the lower light condensing layer 241. Thus, the pixel lens 240 may have a multilayer stepped structure. When the pixel lens 240 has the multilayer stepped structure, the difference width, that is, the widths W1 and W2 may be smaller than the wavelength of incident light. That is, in the pixel lens, the lower layer exposed by the upper layer has a smaller width than the wavelength of incident light. More specifically, the difference in width, that is, the widths W1 and W2 between the upper light condensing layer 242 and the lower light condensing layer 241 may be smaller than the wavelength of the incident light of which colors are separated through the color filter layer 250. Through this structure, the pixel lens 240 having a multilayer stepped structure can condense light as a conventional hemispherical lens does. This is based on the sub-wavelength optics. The widths W1 and W2 form step widths between the upper layer 242 and the lower layer 241 at both ends respectively, and may be equal to each other (W1=W2) or different from each other (W1≠W2).

The plurality of light condensing layers 241 and 242 may have the same shape, and be arranged in parallel. Specifically, the plurality of light condensing layers 241 and 242 may have a circular shape, a polygonal shape including a quadrangular shape, or the like.

To further improve light condensing efficiency, a thickness t2 of the upper light condensing layer 242 may be less than or equal to the thickness t1 of the lower light condensing layer 241, i.e., t1≥t2. Furthermore, to further improve light condensing efficiency, the upper light condensing layer 242 may have a refractive index less than or equal to that of the lower light condensing layer 241. The plurality of light condensing layers 241 and 242 may include a transparent material. When the upper light condensing layer 242 and the lower light condensing layer 241 have the same refractive index, the upper light condensing layer 242 and the lower light condensing layer 241 may be formed of the same material.

Since the plurality of light condensing layers 241 and 242, that is, the pixel lens 240 is positioned at the bottom of the color filter layer 250, the plurality of light condensing layers 241 and 242 may include various materials used in a typical semiconductor fabrication process. For example, the plurality of light condensing layers 241 and 242 may include transparent materials which may include inorganic materials such as silicon oxide, silicon nitride, and titanium nitride. The light condensing layers 241 and 242 may have a single-layer structure or multilayer structure in which transparent materials having different refractive indexes are stacked. When each of the plurality of light condensing layers 241 and 242 has the multilayer structure, the refractive index of each light condensing layer may vary depending on position. An upper layer of each light condensing layer may have a refractive index that is less than a lower layer of each light condensing layer. That is, the refractive index of each light condensing layer may increase as the light condensing layers are adjacent to the photoelectric conversion element 220 or the focusing layer 230.

The color filter layer 250 for color separation may be formed over the focusing layer 230 to cover the pixel lens 240, and have a flat surface. Since the color filter layer 250 is in contact with the pixel lens 240 and covers the pixel lens 240, light transmission between the color filter layer 250 and the pixel lens 240 may be improved. That is, light condensing efficiency may be improved. The color filter layer 250 may include a red filter, a green filter, a blue filter, a cyan filter, a yellow filter, a magenta filter, an infrared pass filter, an infrared cutoff filter, a white filter, or a combination thereof. To further improve the light condensing efficiency, the color filter layer 250 may have a smaller refractive index than the pixel lens 240.

The anti-reflection structure 260 or 270 may be formed over the color filter layer 250 and include an anti-reflection layer 260 shown in FIG. 2A or a hemispherical lens 270 shown in FIG. 2B. The anti-reflection layer 260 may include two or more material layers which have different refractive indexes and are alternately stacked one or more times. The hemispherical lens 270 may not only prevent reflection of incident light, but also condense light incident on the pixel lens 240.

As the image sensor having the above-described structure includes the pixel lens 240 having a multilayer stepped structure, the light condensing efficiency in the unit pixel 110 may be improved. Furthermore, as the color filter layer 250 has a shape to cover the pixel lens 240, the light condensing efficiency in the unit pixel 110 may be further improved. As the light condensing efficiency in the unit pixel 110 is improved, quantum efficiency in the photoelectric conversion element 220 may also be improved. As a result, the performance of the image sensor may be improved.

As seen in FIG. 1, the image sensor includes the pixel array 100 in which the plurality of unit pixels 110 has been arrayed in a two-dimensional manner. As a high-integration image sensor is being developed, the characteristics of the image sensor are deteriorated due to a difference in the chief ray angle (CRA) and the amount of incident light according to the positions of unit pixels 110 in the pixel array 100. Specifically, shading variations are generated because the amount of incident light at the edge of the pixel array 100 is smaller than the amount of incident light at the center of the pixel array 100, thereby directly deteriorating picture quality.

Accordingly, in the following embodiments, an image sensor including a pixel lens array, which is capable of compensating for a difference in the amount of incident light attributable to the positions of unit pixels in the pixel array, is described in detail with reference to the accompanying drawings. The same reference numerals to be used for the same configuration.

Figure 3:
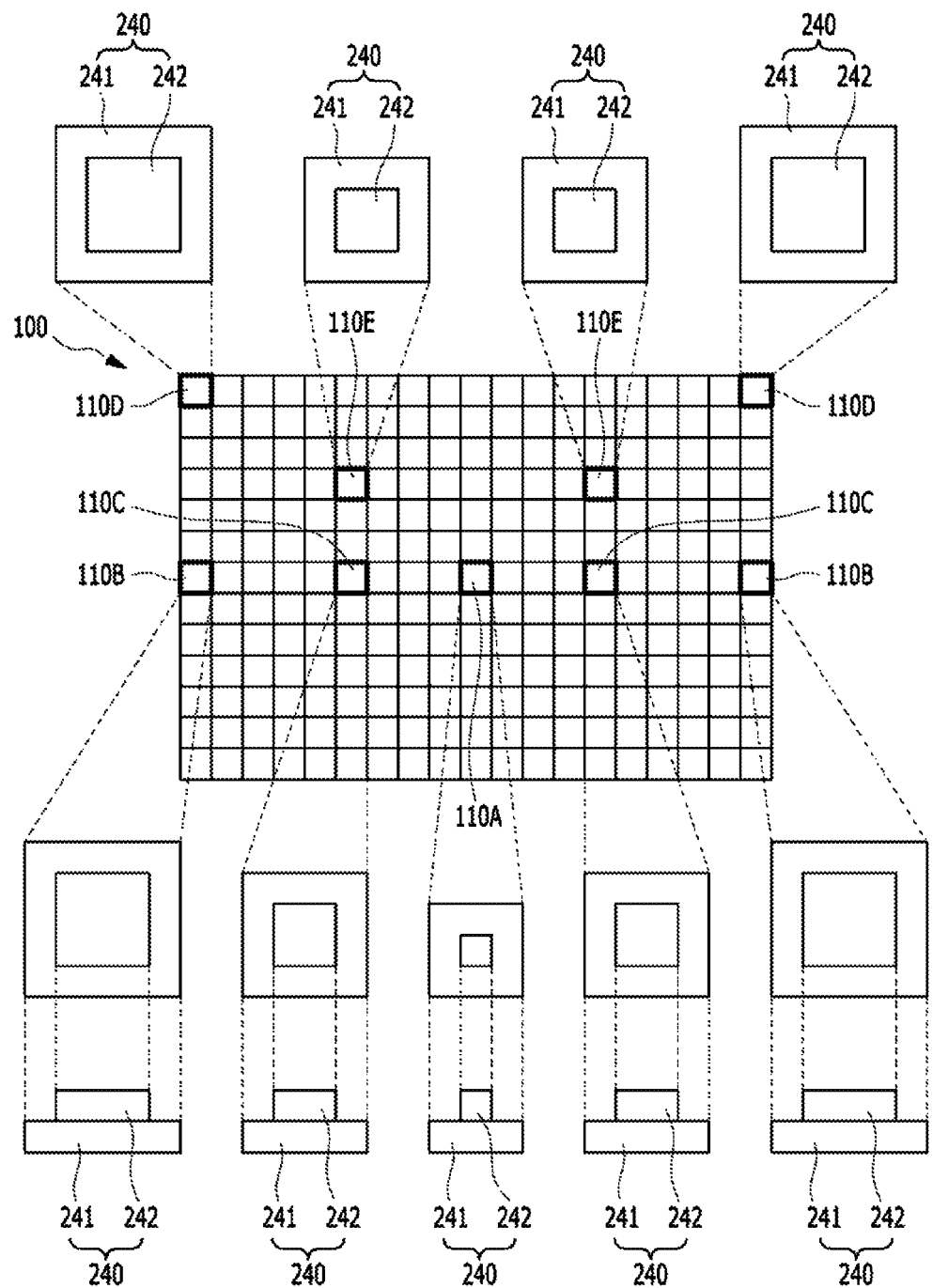
FIG. 3 is a diagram illustrating an image sensor including a pixel lens array in accordance with an embodiment of the present invention.
Figure 4:
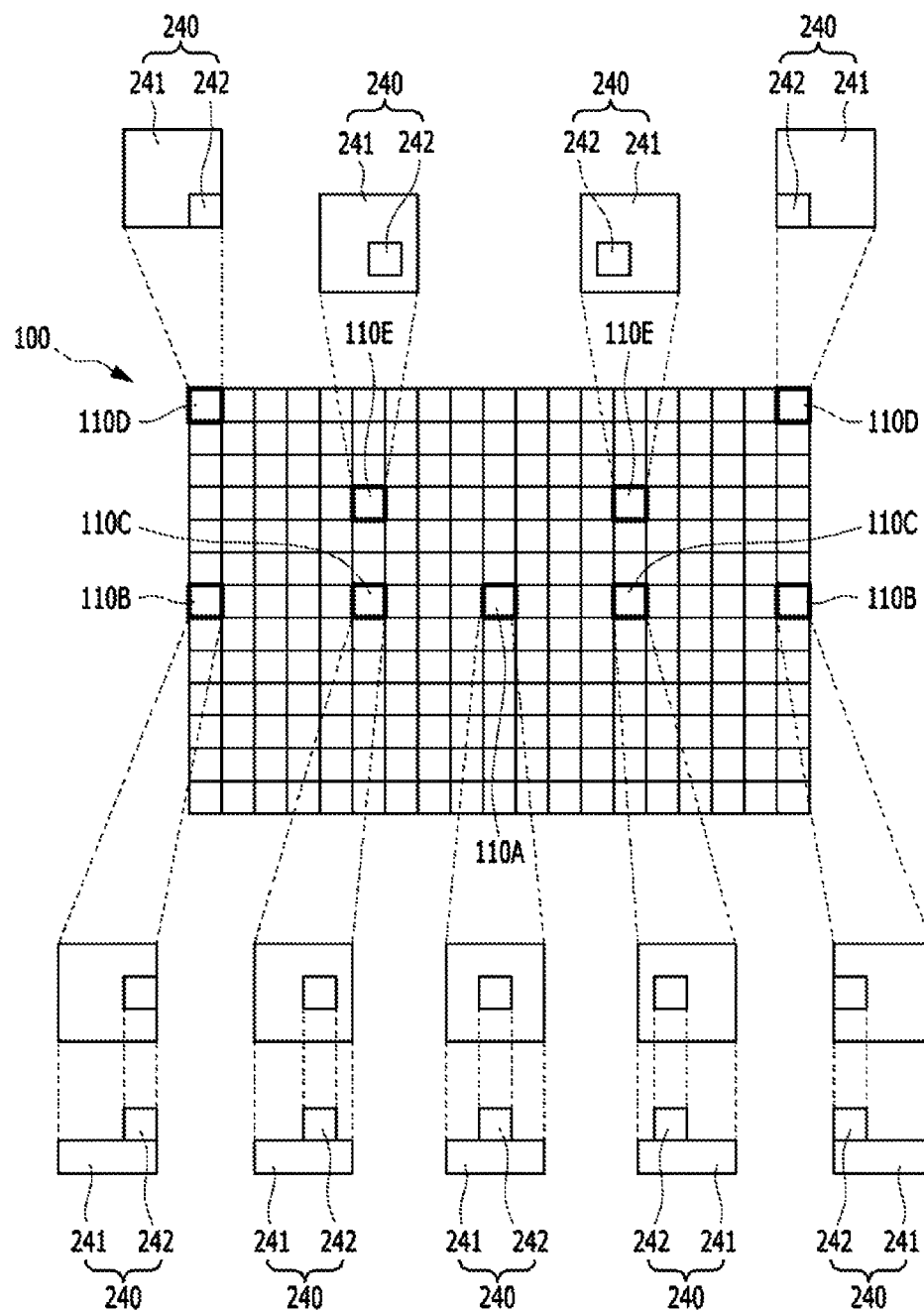
FIG. 4 is a diagram illustrating an image sensor including a pixel lens array in accordance with another embodiment of the present invention.
Figure 5:
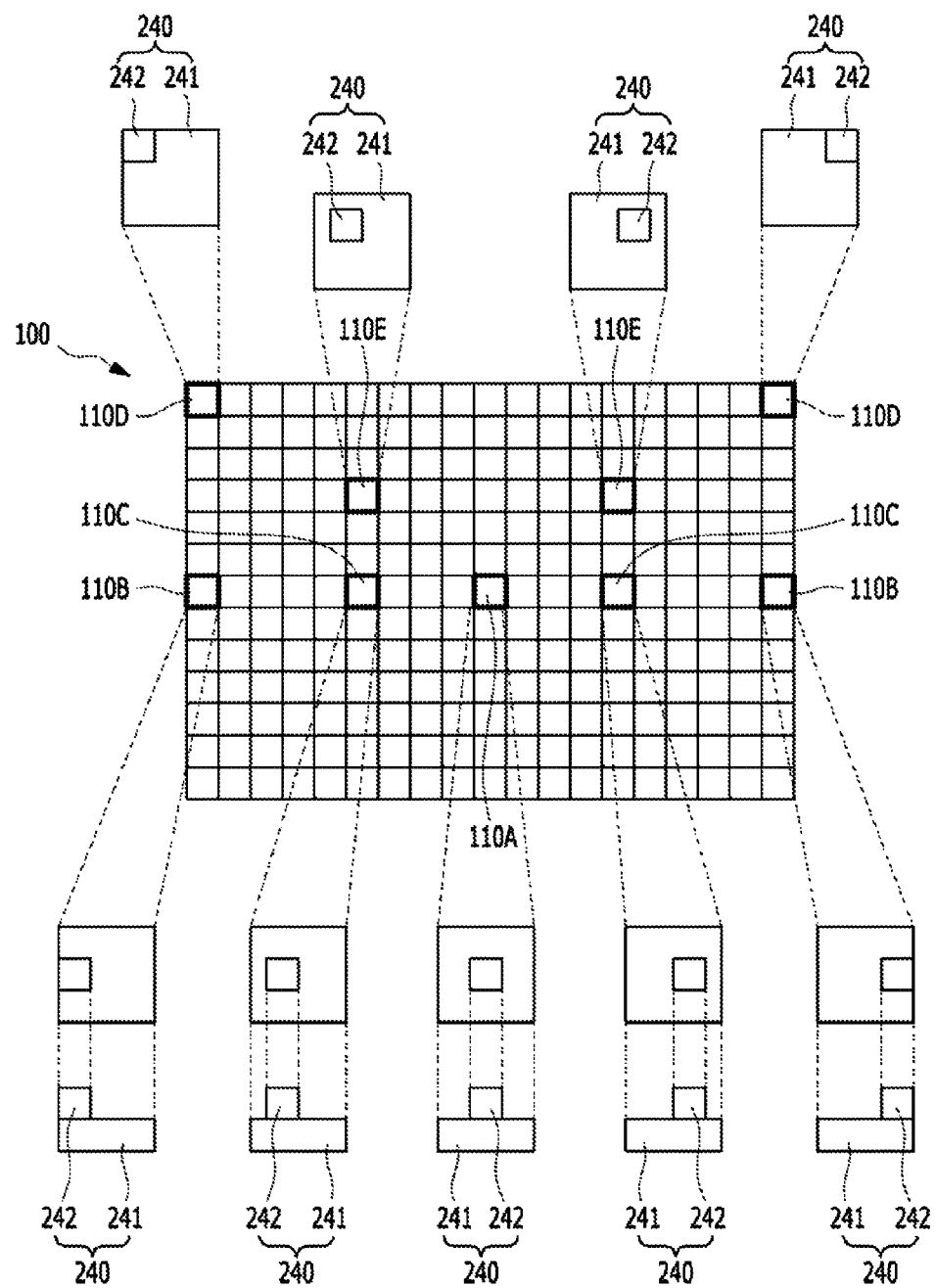
FIG. 5 is a diagram illustrating a modified example of the image sensor shown in FIG. 4.

In FIGS. 3 to 5, a pixel array 100 in which a plurality of unit pixels has been arrayed in a two-dimensional manner may include a first pixel 110A to a fifth pixel 110E. The first pixel 110A to the fifth pixel 110E have been illustrated in order to describe a change in the shapes of pixel lenses 240 attributable to the positions of the first to fifth pixels 110A to 110E within the pixel array 100. Specifically, the pixel array 100 may include the first pixel 110A placed at the center of the pixel array 100, the second pixel 110B placed at the edge of a row line including the first pixel 110A, the third pixel 110C placed in the middle of the first pixel 110A and the second pixel 110B in the row line including the first pixel 110A, the fourth pixel 110D placed at the corner of an edge of the pixel array 100, and the fifth pixel 110E placed in the middle of the first pixel 110A and the fourth pixel 110D in a line that is extended from the first pixel 110A to the fourth pixel 110D.

FIG. 3 is a diagram illustrating an image sensor including a pixel lens array in accordance with an embodiment of the present invention.

As illustrated in FIG. 3, in the pixel array 100 in which the plurality of unit pixels 110A, 110B, 110O, 110D, and 110E have been arrayed in a two-dimensional manner, each of the plurality of unit pixels 110A 110B, 110C, 110D, and 110E may include a photoelectric conversion element and the pixel lens 240 formed on the photoelectric conversion element and configured to include a plurality of light condensing layers in which a lower light condensing layer 241 has a larger area than an upper light condensing layer 242. In this case, the pixel lens 240 may have a shape changing according to a position of each of the plurality of unit pixels 110A, 110B, 110C, 110, and 110E from the center of the pixel array 100 to the edge of the pixel array 100.

Specifically, the pixel lens 240 may have symmetry on the basis of the central axis (or optical axis) of each of the plurality of unit pixels 110A, 110B, 110C, 110D, and 110E, and the area (or size) of the pixel lens 240 may be gradually increased from the center of the pixel array 100 to the edge of the pixel array 100.

That is, the pixel lens 240 of the first pixel 110A placed at the center of the pixel array 100 may have the smallest area. The pixel lenses 240 of the second pixel 110B and the fourth pixel 110D placed at the edges of the pixel lens 240 may have the greatest size. The area of the pixel lens 240 may be linearly increased from the center of the pixel array 100 to the edge of the pixel array 100.

A width of the lower light condensing layer 241 exposed by the upper light condensing layer 242 in the pixel lens 240 may be constant regardless of the position of the pixel lens 240 in the pixel array 100. That is, the width of the lower light condensing layer 241 exposed by the upper light condensing layer 242 in the pixel lens 240 of each of the first pixel 110A to the fifth pixel 110E may be the same. Furthermore, the width of the lower light condensing layer 241 exposed by the upper light condensing layer 242 may be constant regardless of the direction because the pixel lens 240 is symmetrical based on the central axis of each of the plurality of unit pixels 110A, 110B, 110C, 110D, and 110E. In this case, the width of the lower light condensing layer 241 exposed by the upper light condensing layer 242 in the pixel lens 240 may be smaller than the wavelength of incident light.

As described above, the pixel lens 240 has symmetry on the basis of the central axis (or optical axis) of each of the plurality of unit pixels 110A, 110B, 110C, 110D and 110E, and the area of the pixel lens 240 is gradually increased from the center of the pixel array 100 to the edge of the pixel array 100. Accordingly, the amount of incident light at the edge of the pixel array 100 may be increased. Furthermore, a difference in the amount of incident light between the center and edge of the pixel array 100 may be reduced.

FIG. 4 is a diagram illustrating an image sensor including a pixel lens array in accordance with another embodiment of the present invention, and FIG. 5 is a diagram illustrating a modified example of the image sensor shown in FIG. 4.

As illustrated in FIGS. 4 and 5, in the pixel array 100 in which the plurality of unit pixels 110A, 110B, 110C, 110E) and 110E have been arrayed in a two-dimensional manner, each of the plurality of unit pixels 110A, 110B, 1100, 110D, and 110E may include a photoelectric conversion element and the pixel lens 240 formed on the photoelectric conversion element and configured to have a plurality of light condensing layers in which an upper light condensing layer 242 has a smaller area than a lower light condensing layer 241. The pixel lens 240 may have a shape changing according to a position of each of the plurality of unit pixels 110A, 110B, 110C, 110D, and 110E from the center of the pixel array 100 to the edge of the pixel array 100.

Specifically, the pixel lens 240 of each of the plurality of unit pixels 110A, 110B, 110C, 110D, and 110E has the same area (or size), and asymmetry of the pixel lens 240 may be gradually increased from the center of the pixel array 100 to the edge of the pixel array 100 on the basis of the central axis of each of the plurality of unit pixels 110A, 110B, 110C, 110D, and 110E.

The pixel lens 240 of the first pixel 110A placed at the center of the pixel array 100 may have symmetry on the basis of the central axis of the first pixel 110A. The pixel lenses 240 of the second pixel 110B and the fourth pixel 110D may have the greatest asymmetry on the basis of the central axis of each of the second pixel 110B and the fourth pixel 110D.

When the asymmetry of the pixel lens 240 is gradually increased from the center of the pixel array 100 to the edge of the pixel array 100 on the basis of the central axis of each of the plurality of unit pixels 110A, 110B, 110C, 110D, and 110E as described above, it may mean that a maximum width of the lower light condensing layer 241 exposed by the upper light condensing layer 242 in the pixel lens 240 is gradually increased from the center of the pixel array 100 to the edge of the pixel array 100. The maximum width may be linearly increased. Furthermore, the maximum width of the lower light condensing layer 241 exposed by the upper light condensing layer 242 in the pixel lens 240 may be smaller than the wavelength of incident light. For reference, since the pixel lens 240 has asymmetry, a width of the lower light condensing layer 241 exposed by the upper light condensing layer 242 in the pixel lens 240 may be different depending on direction.

More specifically, referring to FIG. 4, the upper light condensing layer 242 of the pixel lens 240 may be shifted more to the center of the pixel array 100 on the basis of the central axis of each of the plurality of unit pixels 110A, 110B, 110C, 110D, and 110E as the pixel lens 240 is positioned from the center of the pixel array 100 to the edge of the pixel array 100. The pixel lens 240 is configured to have a close shape in a chief ray angle (CRA) direction in accordance with the principle of a grated index (GRIN) lens, thereby increasing the amount of incident light at the edge of the pixel array 100.

Referring to FIG. 5, in opposition to FIG. 4, the upper light condensing layer 242 of the pixel lens 240 may be shifted more to the edge of the pixel array 100 on the basis of the central axis of each of the plurality of unit pixels 110A, 110B, 110C, 110D, and 110E as the pixel lens 240 is positioned from the center of the pixel array 100 to the edge of the pixel array 100. The amount of incident light at the edge of the pixel array 100 may be increased in such a manner that incident light emitted to outside the pixel lens 240 is guided to prevent crosstalk.

As described above, the pixel lens 240 of each of the plurality of unit pixels 110A, 110B, 110C, 110D, and 110E has the same area, and the asymmetry of the pixel lens 240 is gradually increased from the center of the pixel array 100 to the edge of the pixel array 100 on the basis of the central axis of each of the plurality of unit pixels 110A, 110B, 110C, 110D, and 110E. Accordingly, the amount of incident light at the edge of the pixel array 100 may be increased. Furthermore, a difference in the amount of incident light between the center and edge of the pixel array 100 may be reduced.

This technology may improve light collection efficiency in a unit pixel because the pixel lens is included.

Furthermore, the amount of incident light at the edge of the pixel array may be increased and a difference in the amount of incident light between the center and edge of the pixel array may be reduced by controlling the shapes of pixel lenses depending on the positions of the pixel lenses within the pixel array.

As described above, quantum efficiency in a photoelectric conversion element may be improved because light collection efficiency and the amount of incident light in a unit pixel are increased. As a result, performance of an image sensor may be improved.

The image sensor in accordance with an embodiment of the present invention may be used in various electronic devices or systems. Hereafter, the image sensor in accordance with an embodiment of the present invention which is applied to a camera will be described with reference to FIG. 6.

Figure 6:
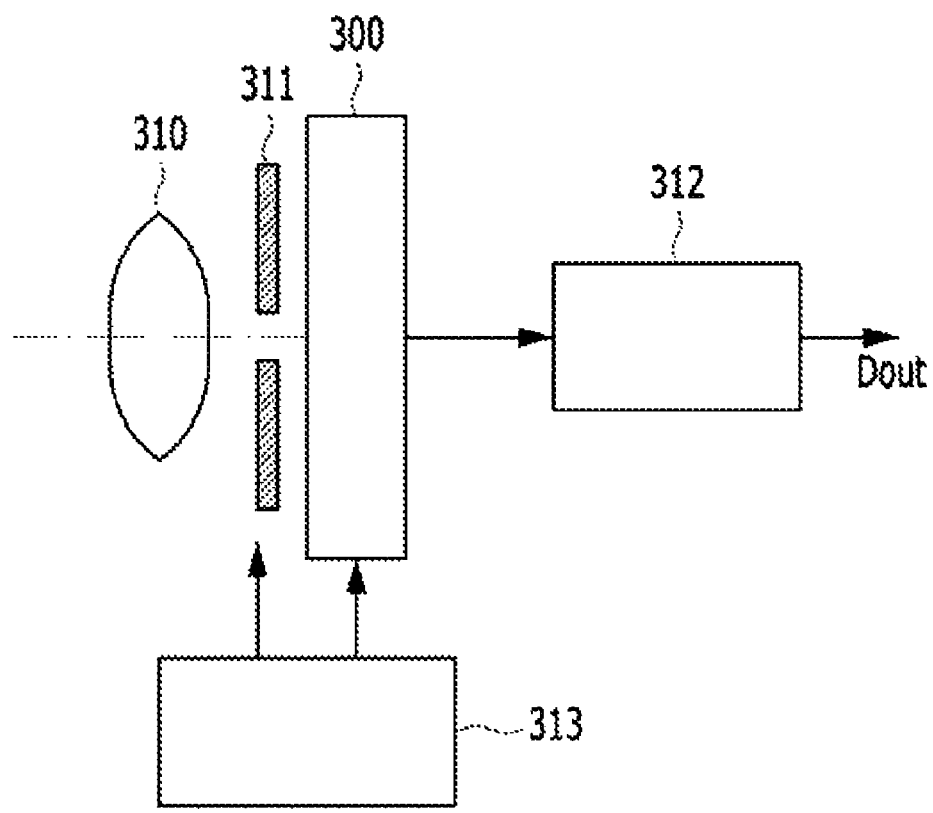
FIG. 6 is a diagram illustrating an electronic device including an image sensor in accordance with an embodiment of the present invention.

FIG. 6 is a diagram briefly illustrating an electronic device including an image sensor in accordance with an embodiment of the present invention.

Referring to FIG. 6, the electronic device including the image sensor 300 in accordance with the embodiment of the present invention may include a camera capable of taking a still image or moving image. The electronic device may include the image sensor 300, an optical system or optical lens 310, a shutter unit 311, a driving unit 313 for controlling/driving the image sensor 300 and the shutter unit 311 and a signal processing unit 312.

The optical system 310 may guide image light, that is, incident light, from an object to the pixel array 100 (refer to FIG. 1) of the image sensor 300. The optical system 310 may include a plurality of optical lenses. The shutter unit 311 may control a light irradiation period and a light shield period for the image sensor 300. The driving unit 313 may control a transmission operation of the image sensor 300 and a shutter operation of the shutter unit 311. The signal processing unit 312 may process signals outputted from the image sensor 300 in various manners. The processed image signals Dout may be stored in a storage medium such as a memory or outputted to a monitor or the like.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
   a pixel array including a plurality of unit pixels, wherein each of the plurality of unit pixels comprises:
      a photoelectric conversion element; and
      a pixel lens over the photoelectric conversion element and comprising a plurality of light condensing layers in which a lower layer has a larger area than an upper layer,
      wherein the pixel lens has a shape changing based on its position from a center of the pixel array to an edge of the pixel array,
   wherein each of the plurality of unit pixels further comprises:
      a focusing layer between the photoelectric conversion element and the pixel lens;
      a color filter layer covering an entire surface of the pixel lens; and
      an anti-reflection structure over the color filter layer,
      wherein each of the plurality of light condensing layers has a flat surface.

2. The image sensor of claim 1, wherein the pixel lens has a multilayer stepped shape.

3. The image sensor of claim 1, wherein the plurality of light condensing layers of the pixel lens have the same shape and are parallel to each other.

4. The image sensor of claim 1, wherein a thickness of the upper layer of the plurality of light condensing layers is less than or equal to a thickness of the lower layer.

5. The image sensor of claim 1, wherein a refractive index of the upper layer of the plurality of light condensing layers is less than or equal to a refractive index of the lower layer.

6. The image sensor of claim 1, wherein:
   the pixel lens is symmetrical based on a central axis of each of the plurality of unit pixels, and an area of the pixel lens is gradually increased from the center of the pixel array to the edge of the pixel array.

7. The image sensor of claim 6, wherein a width of the lower layer exposed by the upper layer in the plurality of light condensing layers is constant regardless of its position in the pixel array.

8. The image sensor of claim 7, wherein the width of the lower layer exposed by the upper layer is smaller than a wavelength of incident light.

9. The image sensor of claim 1, wherein:
the pixel lenses of each of the plurality of unit pixels are the same size, and
asymmetry of the pixel lens is gradually increased based on a central axis of each of the plurality of unit pixels going from the center of the pixel array to the edge of the pixel array.

10. The image sensor of claim 9, wherein the upper layer of the plurality of light condensing layers is shifted more to the center of the pixel array based on the central axis of each of the plurality of unit pixels going from the center of the pixel array to the edge of the pixel array.

11. The image sensor of claim 9, wherein the upper layer of the plurality of light condensing layers is shifted more to the edge of the pixel array based on the central axis of each of the plurality of unit pixels going from the center of the pixel array to the edge of the pixel array.

12. The image sensor of claim 9, wherein a maximum width of the lower layer exposed by the upper layer in the plurality of light condensing layers is gradually increased going from the center of the pixel array to the edge of the pixel array.

13. The image sensor of claim 12, wherein the maximum width of the lower layer exposed by the upper layer is smaller than a wavelength of incident light.

14. An electronic device comprising:
an optical system;
an image sensor suitable for receiving light from the optical system and comprising a pixel array including a plurality of unit pixels; and
a signal processing unit suitable for performing a signal processing operation on a signal output from the image sensor,
wherein each of the plurality of unit pixels of the image sensor comprises:
a photoelectric conversion element; and
a pixel lens over the photoelectric conversion element and comprising a plurality of light condensing layers in which a lower layer has a larger area than an upper layer,
wherein the pixel lens has a shape changing based on a position of a corresponding unit pixel going from a center of the pixel array to an edge of the pixel array,
wherein each of the plurality of unit pixels further comprises:
a focusing layer between the photoelectric conversion element and the pixel lens;
a color filter layer covering an entire surface of the pixel lens; and
an anti-reflection structure over the color filter layer,
wherein each of the plurality of light condensing layers has a flat surface.

15. The electronic device of claim 14, wherein:
the pixel lens is symmetrical based on a central axis of each of the plurality of unit pixels, and
an area of the pixel lens is gradually increased going from the center of the pixel array to the edge of the pixel array.

16. The electronic device of claim 14, wherein:
the pixel lenses of the unit pixels are the same size, and
asymmetry of the pixel lens is gradually increased based on a central axis of each of the plurality of unit pixels from the center of the pixel array to the edge of the pixel array.

17. The electronic device of claim 14, wherein the pixel lens has a multilayer stepped shape.

18. The electronic device of claim 14, wherein a width of the lower layer exposed by the upper layer in the plurality of light condensing layers is smaller than a wavelength of incident light.

* * * * *